Jan. 13, 1959 S. PHANOS 2,868,898

CRYSTAL FILTER CIRCUIT

Filed Nov. 29, 1956 2 Sheets-Sheet 1

Inventor
STEPHEN PHANOS
By [signature]
Attorney

Jan. 13, 1959 S. PHANOS 2,868,898

CRYSTAL FILTER CIRCUIT

Filed Nov. 29, 1956 2 Sheets-Sheet 2

Inventor
STEPHEN PHANOS

By [signature]
Attorney

United States Patent Office 2,868,898

Patented Jan. 13, 1959

2,868,898

CRYSTAL FILTER CIRCUIT

Stephen Phanos, Long Island City, N. Y., assignor to International Telephone and Telegraph Corporation, Nutley, N. J., a corporation of Maryland Application November 29, 1956, Serial No. 626,798

7 Claims. (Cl. 179—171)

This invention relates to filters and more particularly to filter circuits utilizing quartz crystals as the filter medium.

Quartz crystals exhibiting the piezoelectric effect are commonly used in electric wave filter applications to pass signals of a desired frequency and reject all other frequencies. Quartz crystals however have only one fundamental resonant frequency and other secondary resonant frequencies or spurious frequencies at which the crystals will vibrate. Even though the amplitudes of the secondary or spurious resonant frequencies are smaller than the amplitude of the fundamental resonant frequency, these undesired spurious frequencies will come through the crystal. It is common practice, in order to eliminate the spurious frequencies, to connect two quartz crystals in series, said two crystals having the same fundamental resonant frequency but different spurious frequencies. The output of the first crystal will have a frequency spectrum consisting of a band of frequencies centered about the frequency of the fundamental series resonance, which can be defined as the band pass region, and which are of large amplitudes and a number of spurious frequencies having smaller amplitudes. If this spectrum is now applied to another crystal having different spurious resonant frequencies but the same fundamental resonant frequency, the output of the second crystal will be free from the spurious frequencies of the first crystal and will consist only of the said band pass region frequencies centered about the said fundamental resonant frequency. The spectrum has therefore been cleaned of the spurious frequencies, but a new difficulty has been introduced; by passing the said band pass region signals through two crystals, the total phase shift excursion has been doubled, that is to say, the phase of the said signals in the band pass region has been shifted a maximum of ±180 degrees. In many circuits, and more particularly in feedback networks, the additional phase shift may and often does lead to instability and oscillations.

It is therefore an object of this invention to provide an improved quartz crystal filter circuit which will eliminate the spurious signals and pass through the filter only the desired band pass region signals.

It is further an object of this invention to limit the maximum phase shift excursion of the desired band pass region signals in passing through the said filter circuit to ±90 degrees.

A feature of this invention is the use of two quartz crystals having the same fundamental resonant frequency but different spurious resonant frequencies. A source of signals which contains signals of the same frequencies as the frequencies of the band pass region centered about the fundamental resonant frequency is applied to the first crystal to obtain an output which consists only of the said signals of said band pass region and the spurious resonant frequencies of said first crystal. This output is applied to the second crystal and an output is obtained from said second crystal which consists of only the said spurious resonant frequencies. The outputs of the first crystal and the second crystal are applied to the inputs of a difference amplifier and a signal output is obtained therefrom which consists only of the said signals of said band pass region; the said spurious resonant frequencies are eliminated in the difference amplifier and the phase shift excursion of the desired signals of said band pass region is limited to ±90°.

The above mentioned and other features and objects of this invention will become more apparent by reference to the following description taken in conjunction with the accompanying drawings, in which.

Figure 1:
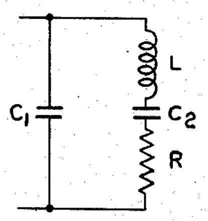
Fig. 1 is the equivalent electrical circuit of a quartz crystal.
Figures 2, 3:
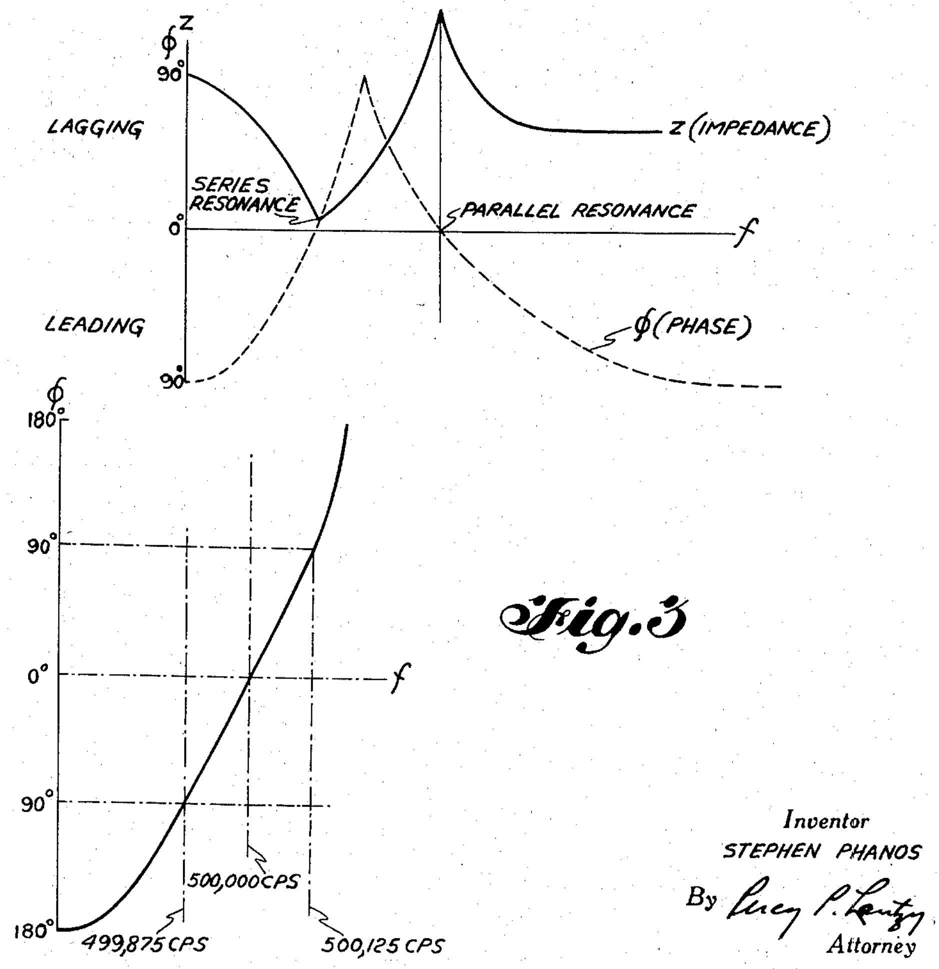
Fig. 2 is the impedance and phase shift vs. frequency graph of a quartz crystal.
Fig. 3 shows the phase shift vs. frequency graph of two quartz crystals connected in series.

Referring to Fig. 1, the equivalent circuit of a quartz crystal shows a series combination of L, $C_2$, and R which represents the equivalent mass, compliance and frictional loss of the vibrating crystal, respectively. $C_1$ represents the holder capacity, or in other terms the electrostatic capacity between the crystal electrodes when the crystal is in place but not vibrating. The impedance offered by the crystal to electrical circuits is of the character shown in Fig. 2, being large at the resonant frequency of L and $C_2+C_1$ which is called the parallel resonance, and low at a nearby frequency for which L and $C_2$ are in series resonance. Referring to Fig. 2 it is seen that the phase is 90 degrees leading below series resonance, goes up to zero degrees at series resonance, then to 90 degrees lagging, back to zero degrees at parallel resonance and finally to 90 degrees leading above this point.

With reference to Fig. 3, there is shown the frequency vs. phase characteristics of the signal when two crystals are connected in series. Using 500,000 C. P. S. as the center fundamental resonant frequency of the two crystals and a bandwidth of the crystals of 250 C. P. S. which is representative of commercial crystals, the phase shift at the center frequency is zero degrees, at 499,875 C. P. S. it is −90 degrees and at the upper limit of the bandwidth, 500,125 C. P. S., it is +90 degrees.

Figure 4:
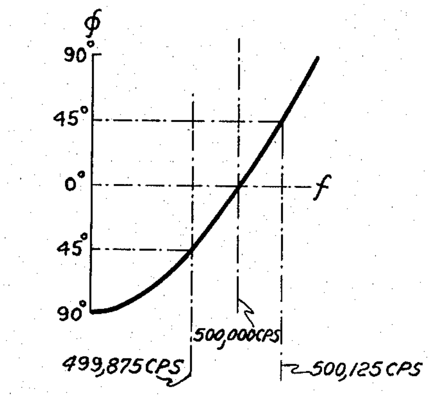
Fig. 4 illustrates the phase shift vs. the frequency graph of two quartz crystals as used in this invention.

Referring to Fig. 4 which indicates the results obtained in this invention it is seen that the phase shift over the same frequency range varies from −45 degrees to +45 degrees. It is seen from this illustrative example that for the same amount of deviation from the center frequency of the crystal the phase shift is half of that obtained from using two crystals in series. Therefore, it is evident that the maximum phase shift excursion of the bandpass region frequencies is ±180° for the crystals connected in series and only ±90° for this invention.

Figure 5:
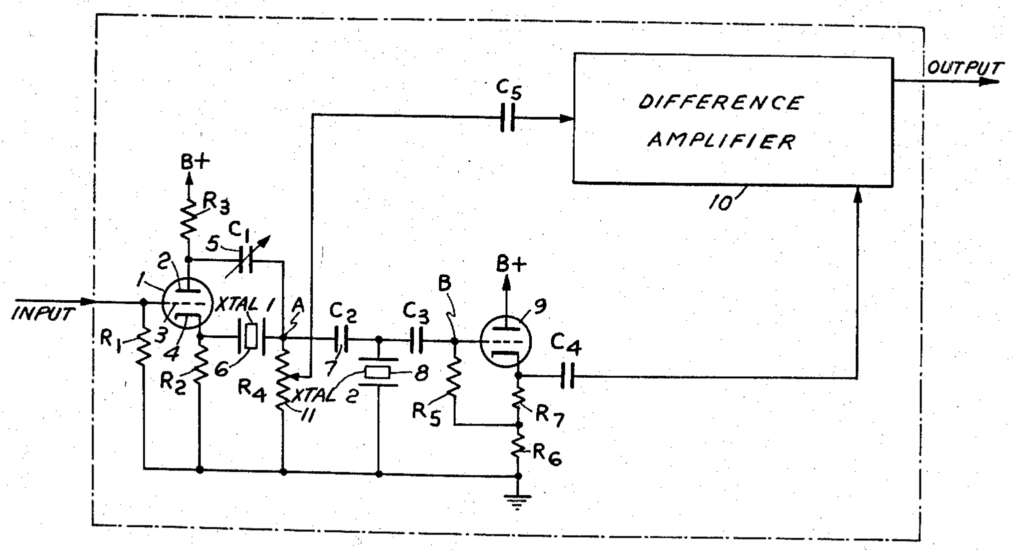
Fig. 5 is the schematic diagram of an embodiment of this invention.

Referring to Fig. 5, the vacuum tube 1 is a paraphase amplifier which provides a low output impedance and an output waveform at the anode 2 which is similar to the input waveform at the control grid 3 but is 180 degrees out of phase; the output signal at the cathode 4 is in phase with the input signal at the control grid 3. The variable capacitor 5 is connected between the anode 2 of the tube 1 and the output of the crystal 6 in order to neutralize the holder capacitance of the crystal 6. The signals which pass through the crystal 6 are of very large amplitude for the signals of the said band pass region, smaller amplitudes for the said spurious resonant frequencies and much smaller amplitudes for the other signals which come through. The crystal 6 is in series resonance for the fundamental resonant frequency and the spurious resonant frequencies. For all other signals the said crystal 6 has an impedance depending on the holder capacity. This impedance is very high in comparison with resistor 11. Under this condition the said other signals at point A will have very small amplitudes. The signals which pass through the capacitor 5, which is adjusted to be of the same value as the holder capacitance of the crystal 6 are attenuated to the same degree as said other signals passing through the said crystal 6 but are 180 degrees out of phase. When the signals from the anode 2 and the cathode 4 join at point A they cancel out with the exception of the signals of said band pass region and the spurious frequencies which are only reduced slightly in amplitude.

The output at point B will consist of the frequencies which have passed through crystal 6 attenuated by a constant amount determined by the capacitor 7 and the holder capacitance of crystal 8 with the exception of the signals of said band pass region centered about the fundamental series resonant frequency of crystals 6 and 8. The attenuation will be constant and independent of frequency. At the series resonant point the crystal 8 in effect behaves like a very low resistance, the capacitor 7 in comparison has a very large impedance and therefore the attenuation of the signals of said band pass region will be very high. At all the spurious frequencies of crystal 6 the crystal 8 will have an impedance depending on the holder capacitance of crystal 8 and will very inversely as the frequency. The impedance of capacitor 7 will have an impedance depending on the value of the capacitor and will also vary inversely as the frequency. Therefore, the attenuation of said spurious frequencies at point B will be constant and will depend only on the value of capacitor 7 and the holder capacitance of crystal 8. The value of capacitor 7 is chosen so that in connection with the holder capacitance of crystal 8 the attenuation of said spurious frequencies at point B will be small. The result then is that at point B there will be present only the spurious frequencies passing through the crystal 6, and the signals of said band pass region centered about the fundamental resonant frequency of the crystals 6 and 8 will not appear. Tube 9 is a cathode follower and is used to maintain the Q of the crystal at a high level. The output of tube 9 is passed to one input of a difference amplifier 10, of the type, for example, described in "Electron-Tube Circuits" by Samuel Seely, published by McGraw-Hill Book Company, Inc., at pp. 113–117. The signals from the output of crystal 6 adjusted in amplitude by variable resistor 11 are passed to the second input of said difference amplifier 10, and the signal output of tube 9 is subtracted from the signal output of crystal 6. Consequently, the spurious frequencies appearing in both signals being equal in magnitude cancel out and the signal output of the difference amplifier 10 is the desired signals of said band pass region which appears only in the output of the crystal 6, and will have a maximum phase shift excursion of ±90°.

It will be understood, of course, that the transducers 1 and 9 may comprise transistors instead of vacuum tubes if desired.

The circuit of my invention has been applied in a system where the fundamental resonant frequencies of the two crystals are 500,000 C. P. S. Typical parameters chosen in the reduction to practice of the circuit of this invention for that frequency are as follows:

| | |
|---|---|
| $V_1$ | ½ tube type 6201. |
| $V_2$ | ½ tube type 6201. |
| $R_1$ | 470,000 ohms. |
| $R_2$ | 220 ohms. |
| $R_3$ | 220 ohms. |
| $R_4$ | 1,000 ohms, variable resistor. |
| $R_5$ | 2.2 megohms. |
| $R_6$ | 10,000 ohms. |
| $R_7$ | 680 ohms. |
| $C_1$ | 5 mmf. variable capacitor. |
| $C_2$ | 30 mmf. |
| $C_3$, $C_4$, $C_5$ | .01 mf. |
| B+Supply | 150 volts. |

While I have described above the principles of my invention in connection with specific apparatus, it is to be clearly understood that this description is made only by way of example and not as a limitation to the scope of my invention as set forth in the objects thereof and in the accompanying claims.

I claim:

1. A filter circuit comprising first and second crystals having the same fundamental resonant frequency but different spurious resonant frequencies, means coupling to said first crystal a source of signals of plural frequencies including given signals of the same frequencies as the frequencies of a band pass region centered about said fundamental resonant frequency by phase inverting means bypassing said source of signals about said first crystal to obtain a first signal output containing said given signals and the spurious resonant frequencies passed by said first crystal, means coupling said first signal output to said second crystal to shunt said given signals and to obtain a second signal output containing said spurious resonant frequencies only, subtracting means and means coupling said first and second signal outputs to said subtracting means to obtain as the output thereof said given signals only.

2. A filter circuit comprising first and second crystals having the same fundamental resonant frequency but different spurious resonant frequencies, an electron discharge device having at least a cathode, a control electrode and an anode, means coupling to said control electrode a source of signals of plural frequencies including given signals of the same frequencies as the frequencies of a band pass region centered about said fundamental resonant frequency, means coupling said cathode to the input of said first crystal, capacitor means coupling the said anode to the output of said first crystal to obtain a first signal output containing said given signals and the spurious resonant frequencies passed by said first crystal, means coupling said first signal output to said second crystal to shunt out said given signals and to obtain a second signal output containing said spurious resonant frequencies only, subtracting means and means coupling said first and second signal outputs to said subtracting means to obtain as the output thereof said given signals only.

3. A filter circuit comprising first and second crystals having the same fundamental resonant frequency but different spurious resonant frequencies, first and second electron discharge devices, each of said electron discharge device having at least a cathode, a control electrode and an anode, means coupling to the control electrode of said first electron discharge device, a source of signals of plural frequencies including given signals of the same frequencies as the frequencies of a band pass region centered about said fundamental resonant frequency, means coupling the cathode of said first electron discharge device to the input of said first crystal, capacitor means coupling the anode of said first electron discharge device to the output of said first crystal to obtain a first signal output containing said given signals and the spurious resonant frequencies passed by said first crystal capacitor means coupling said first signal output in parallel arrangement to the input of said second crystal and in series to the control electrode of said second electron discharge device to obtain a second signal output from the cathode of said second electron discharge device containing said spurious resonant frequencies only, and means for subtracting said second signal output from said first signal output to obtain said given signals only.

4. A filter circuit comprising first and second crystals having the same fundamental resonant frequency but different spurious resonant frequencies, first and second electron discharge devices each of said electron discharge device having at least a cathode, a control electrode and an anode, means coupling to the control electrode of said first electron discharge device a source of signals of plural frequencies, including given signals of the same frequencies as the frequencies of a band pass region centered about said fundamental resonant frequency, means coupling the cathode of said first electron discharge device to the input of said first crystal, capacitor means coupling the anode of said first electron discharge device to the output of said first crystal to obtain a first signal output containing said given signals and the spurious resonant frequencies of said first crystal capacitor means coupling said first signal output in parallel arrangement to the input of said second crystal and in series to the control electrode of said second electron discharge device to obtain a second signal output from the cathode of said second electron discharge device containing said spurious resonant frequencies only, a difference amplifier having first and second inputs, means for coupling said first signal output to the first input of said difference amplifier, and means for coupling said second signal output to the second input of said difference amplifier, to obtain a signal output from said difference amplifier containing said given signals only.

5. A filter circuit comprising first and second crystals having the same fundamental resonant frequency but different spurious resonant frequencies, a transducer having one input and two outputs wherein, one output is 180° different from the other, means coupling to the input of said transducer a source of signals of plural frequencies including given signals of the same frequencies as the frequencies of a band pass region centered about said fundamental resonant frequency, means coupling one output of said transducer to the input of said first crystal, capacitor means coupling the second output of said transducer to the output of said first crystal to obtain a first signal output containing said given signals and the spurious resonant frequencies passed by said first crystal, means coupling said first signal to said second crystal to shunt said given signals and to obtain a second signal output containing said spurious resonant frequencies only, subtracting means and means coupling said first and second signal outputs to said subtracting means to obtain as the output thereof said given signals only.

6. A filter circuit comprising first and second crystals having the same fundamental resonant frequency but different spurious resonant frequencies, a first transducer having at least one input and two outputs wherein the outputs are 180° different in phase, means coupling to the input of said first transducer a source of signals of plural frequencies including given signals of the same frequencies as the frequencies of a band pass region centered about said fundamental resonant frequency, means coupling one output of said first transducer to the input of said first crystal, capacitor means coupling the second output of said first transducer to the output of said first crystal to obtain a first signal output containing said given signals and the spurious resonant frequencies passed by said first crystal, a second transducer having at least one input and one output wherein the outputs are 180° apart in phase, capacitor means coupling said first signal output in parallel arrangement to the input of said second crystal and in series to the input of said second transducer to obtain a second signal output from said second transducer containing said spurious resonant frequencies only, and means for subtracting said second output from said first output to obtain said given signals only.

7. A filter circuit comprising first and second crystals having the same fundamental resonant frequency but different spurious resonant frequencies, a first transducer having at least one input and two outputs wherein the outputs are 180° apart in phase, means coupling to the input of said first transducer a source of signals of plural frequencies including given signals of the same frequencies as the frequencies of a band pass region centered about said fundamental resonant frequency, means coupling one output of said first transducer to the input of said first crystal, capacitor means coupling the second output of said transducer to the output of said first crystal to obtain a first signal output containing said given signals and the spurious resonant frequencies passed by said first crystal, a second transducer having at least one input and one output, capacitor means coupling said first signal output in parallel arrangement to the input of said second crystal and in series to the input of said second transducer to obtain a second signal output from the said second transducer containing said spurious resonant frequencies only, a difference amplifier having first and second inputs, means for coupling said first signal output to the first input of said difference amplifier, and means for coupling said second signal output to the second input of said difference amplifier to obtain from the output of said difference amplifier said given signals only.

References Cited in the file of this patent

UNITED STATES PATENTS 2,637,779 Craiglow ---------------- May 5, 1953

OTHER REFERENCES

Publications: The Wireless Word "Crystal Band-Pass Filters," Sept. 15, 1938, pp. 251, 252; Nov. 24, 1938, pp. 463, 464.